United States Patent
Vaktnäs

[19]
[11] Patent Number: 6,163,213
[45] Date of Patent: Dec. 19, 2000

[54] AMPLIFIER AND A METHOD OF POWER AMPLIFICATION

[75] Inventor: Christer Vaktnäs, Göteborg, Sweden

[73] Assignee: Telefonaktiebolget LM Ericsson, Stockholm, Sweden

[21] Appl. No.: 09/196,174

[22] Filed: Nov. 20, 1998

[30] Foreign Application Priority Data

Nov. 21, 1997 [SE] Sweden ................................. 9704284

[51] Int. Cl.⁷ ...................................................... H03F 1/26
[52] U.S. Cl. ............................................ 330/149; 330/151
[58] Field of Search ................................. 330/149, 151; 375/297

[56] References Cited

U.S. PATENT DOCUMENTS

| | | | |
|---|---|---|---|
| 4,879,519 | 11/1989 | Myer | 330/149 |
| 5,619,168 | 4/1997 | Myer | 330/149 |
| 5,850,162 | 12/1998 | Danielsons | 330/149 |
| 5,917,375 | 6/1999 | Lisco et al. | 330/151 |

FOREIGN PATENT DOCUMENTS

| | | |
|---|---|---|
| 0 485 183 A2 | 5/1992 | European Pat. Off. . |
| 0 762 630 A1 | 3/1997 | European Pat. Off. . |
| 27 18 172 A1 | 11/1978 | Germany . |

*Primary Examiner*—Steven J. Mottola
*Attorney, Agent, or Firm*—Burns, Doane, Swecker & Mathis, L.L.P.

[57] ABSTRACT

The present invention relates to a power amplifier (400) and to a method of amplifying in the power amplifier (400) a first composite radio signal (RF41) that includes at least two modulated carrier waves. The first radio signal (RF41) is divided into two radio signals (RF42, RF43), which are amplified in a first and a second non-linear amplifier (405, 406). Intermodulation products arise in the amplification of said radio signals in respective amplifiers (405, 406). A compensation signal (RF45) is generated from the output signal (RF46) of the second amplifier (406), and the modulated carrier waves are suppressed selectively, e.g. by filtering out the carrier waves in band-stop filters (408–409). An output signal (RF47) from the power amplifier (400) is generated by reverse phase addition of the compensation signal (RF45) to the output signal (RF44) from the first amplifier (405).

13 Claims, 4 Drawing Sheets

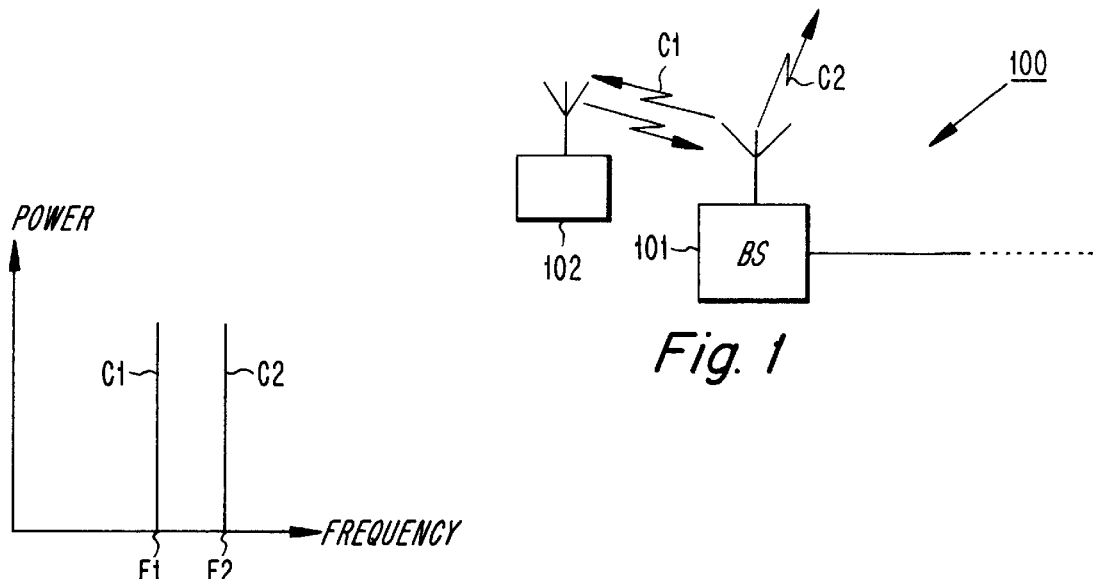
Fig. 1
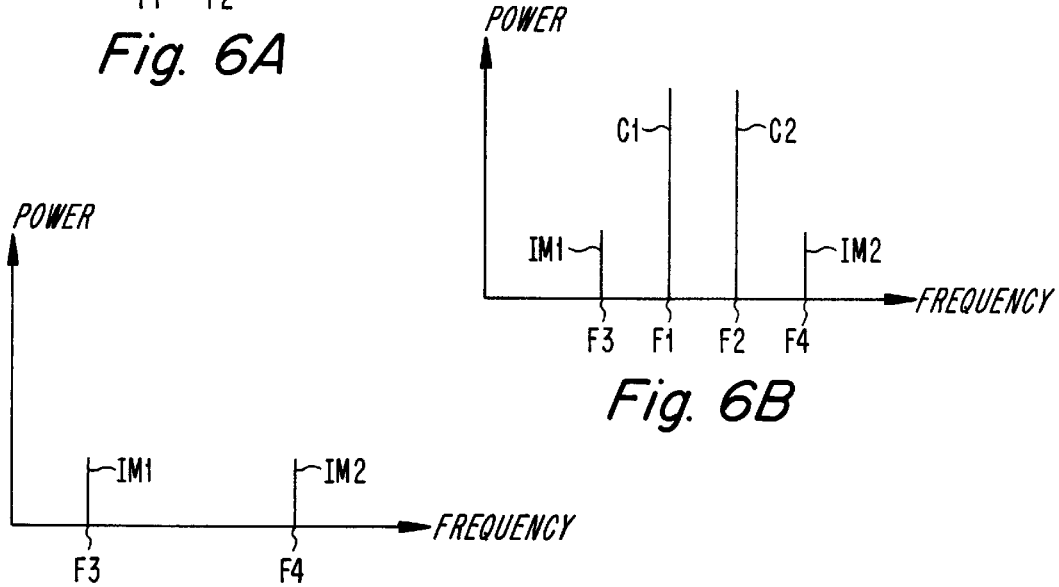
Fig. 6A
Fig. 6B
Fig. 6C
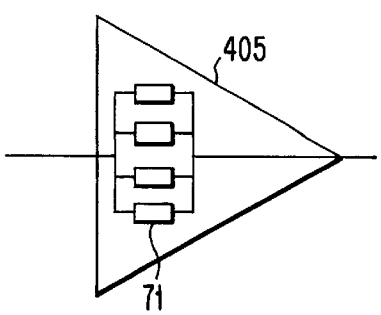
Fig. 7A
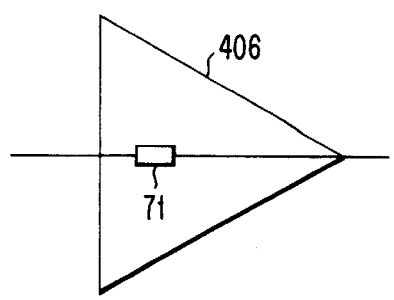
Fig. 7B

AMPLIFIER AND A METHOD OF POWER AMPLIFICATION

CROSS REFERENCE TO RELATED APPLICATION

This application claims priority under 35 U.S.C. §119 from Swedish Patent Application No. 9704284-9, filed Nov. 21, 1997.

FIELD OF INVENTION

The present invention relates to a power amplifier and also to a method of power amplification therein. More specifically, the invention relates to the power amplification of a composite radio signal that includes at least two modulated carrier waves.

BACKGROUND OF THE INVENTION

In mobile telephony systems for instance, information is transferred from a base station to a plurality of mobile stations. The information is transmitted on different carrier waves and it is desirable, for cost reasons, that several carrier waves can be power amplified simultaneously in one and the same power amplifier.

In a power amplifier that is based on a traditional feedforward technique, a radio signal that includes at least two modulated carrier waves is amplified in a first non-linear amplifier, wherewith intermodulation products arise in the output signal of the first amplifier. A small part of the output signal from the first amplifier is added in reverse or opposite phase to a forwardly fed part of the input signal of the first amplifier, wherein the reverse phase addition results in a signal that contains only the earlier mentioned intermodulation products. A compensation signal is generated by amplifying this last-mentioned signal to a suitable power level, in a linear amplifier. A power amplifier output signal is generated by reverse phase addition of the compensation signal to the output signal from the first amplifier, thereby suppressing the intermodulation products in the output signal from the power amplifier.

One problem encountered with power amplification that is based on a traditional feedforward technique arises as a result of the connection to the output of the first amplifier of a number of components that cause power losses and therewith impair the efficiency of the power amplifier.

German Patent Specification DE 27 18 172 teaches an amplifier which when amplifying an input signal that contains several frequencies suppresses intermodulation products in the amplifier output signal. This amplifier is divided internally into a first and a second signal path. The first signal path includes a first non-linear amplifier and the second signal path includes a second non-linear amplifier that is connected in series with an attenuator. The amplifier divides the input signal on the two signal paths, wherewith the first and the second amplifier both generate a respective output signal that includes both a desired signal component corresponding to the input signal and intermodulation products that arise in the amplification process. Due to higher amplification of the input signal in the second amplifier, the output signal from the second amplifier contains much stronger intermodulation products than the output signal from the first amplifier. The output signal from the second amplifier is attenuated in the attenuator, so that the intermodulation products in the attenuated signal are equally as large as the intermodulation products in the output signal from the first amplifier. The amplifier output signal is generated by reverse phase addition of the output signal from the first amplifier to the attenuated output signal from the second amplifier.

One problem encountered with the amplifier taught by DE 27 18 172 resides in the significant losses in power that are experienced. One reason why these power losses occur is because the input signal is amplified much more strongly in the second amplifier than in the first amplifier so that the output signal from the second amplifier can then be attenuated, such that the intermodulation products that are generated in the first and the second signal paths in the subsequent reverse phase addition process will neutralise each other.

Power losses are also caused because the signal obtained subsequent to attenuation in the second signal path still contains a relatively large part of the desired signal component, and hence this part of said signal will cause a power reduction of the desired output signal from the amplifier in said reverse phase addition process.

SUMMARY OF THE INVENTION

The present invention addresses the problem of amplifying a radio signal that includes at least two modulated carrier waves with the aid of a non-linear amplifier whilst, at the same time, counteracting the occurrence of intermodulation products in the amplified signal.

The problem is solved mainly with the aid of a method in which a power amplifier divides the radio signal, which includes at least two modulated carrier waves, into two radio signals which are amplified in a respective first and second non-linear amplifier. Intermodulation products arise in respective amplifiers in the amplification process. A compensation signal is generated from the output signal of the second amplifier, wherewith selective depression of the modulated carrier waves takes place. A power amplifier output signal is generated by reverse phase addition of the compensation signal to the output signal from the first amplifier. The invention thus relates to the aforedescribed method and to a power amplifier that includes means necessary for carrying out the method.

More specifically, the problem is solved by dividing a first composite radio signal that includes at least two modulated carrier waves into a second and a third radio signal in a power amplifier. The second radio signal is amplified in the first amplifier to provide a fourth radio signal which in addition to containing the amplified modulated carrier waves also includes intermodulation products generated in the first amplifier. A fifth radio signal is generated by amplifying the third radio signal in the second amplifier to obtain a sixth radio signal which in addition to containing the amplified modulated carrier waves also includes intermodulation products generated in the second amplifier. The fifth radio signal is generated from the sixth radio signal, wherewith selected suppression of the modulated carrier waves takes place. An output signal is generated from the power amplifier by reverse phase addition of the fourth and fifth radio signals, therewith suppressing the intermodulation products in the output signal.

According to one embodiment of the invention, selected suppression of the modulated carrier waves is effected by filtering-out the modulated carrier waves in band-stop filters.

According to another embodiment of the invention, selective suppression is effected by reverse phase addition of a part of the third radio signal to a part of the output signal from the second amplifier.

An object of the present invention is to provide a method and a power amplifier for the amplification of a radio signal that includes at least two modulated carrier waves while suppressing intermodulation products in the amplified signal at the same time. A more specific object is to provide a power amplifier that has low power losses.

One advantage afforded by the invention is that it enables the implementation of a linearised power amplifier with low power losses.

The invention will now be described in more detail with reference to preferred embodiments thereof and also with reference to the accompanying drawings.

BRIEF DESCRIPTION OF THE DRAWINGS

FIG. 1 is view illustrating part of a radio communications network.

FIGS. 6A–6C are diagrams showing simplified frequency spectrums for different radio signals.

FIGS. 7A–7B are block diagrams illustrating the internal structure of amplifiers used in FIG. 4 and FIG. 5.

DETAILED DESCRIPTION OF PREFERRED EMBODIMENTS

FIG. 1 shows part of a radio communications network 100 in which a base station 101 communicates with a cordless terminal 102, e.g. a mobile telephone, via radio signals. The base station 101 is typically equipped for the simultaneous transmission of a plurality of carrier waves C1–C2. Each of the carrier waves C1–C2 has been conventionally amplified with the aid of separate power amplifiers. Base station hardware costs can be reduced, by using a single power amplifier for the simultaneous amplification of all carrier waves or at least several of said carrier waves.

A conventional amplifier is non-linear, which gives rise to so-called intermodulation products when signals of several frequencies are amplified simultaneously. It is necessary to suppress these intermodulation products to a low level, since they will otherwise cause disturbances and interference in the radio communications network 100 or in some other network/system.

Intermodulation products, and then primarily the so-called third order intermodulation products, are removed conventionally from the output signal of a power amplifier with the aid of some form of feedforward linearisation.

Figure 2:
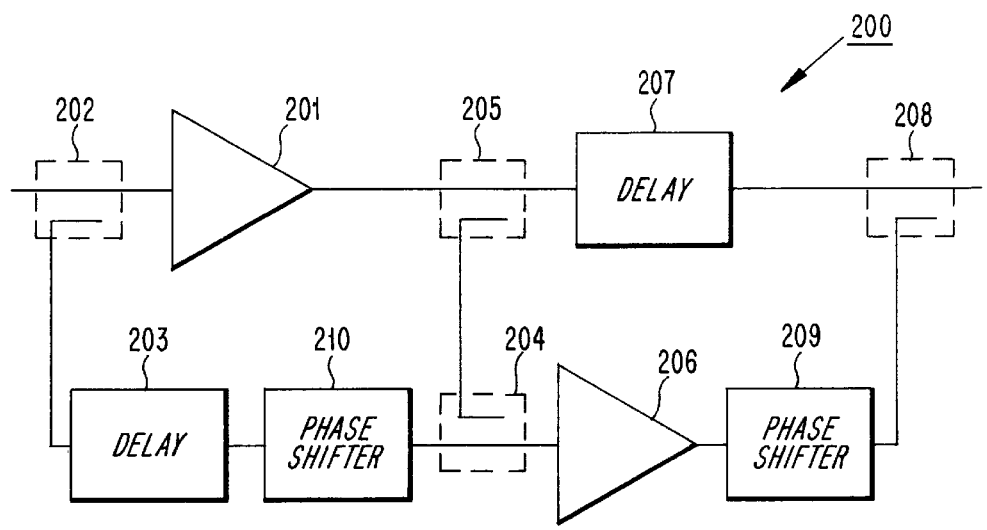
FIG. 2 is a block schematic illustrating a power amplifier according to a traditional feedforward technique.

FIG. 2 illustrates the construction of a power amplifier 200 based on a traditional feedforward technique. The power amplifier 200 includes a first non-linear amplifier 201 which generates an output signal by amplifying a received input signal. A first directional coupler 202 feeds forwards a part of the input signal to a first phase shifter 210 coupled in series with a second directional coupler 204, via a first delay line 203. A third directional coupler 205 diverts a small part of the output signal from the first non-linear amplifier 201 to the second directional coupler 204. The first phase shifter 210 and the second directional coupler 204 together function as reverse phase addition means and add the forwardly fed input signal to the first amplifier 201 in reverse phase to the output signal taken from the same amplifier 201. Provided that the first delay line 203 and the directional couplers 202, 204, 205 are set correctly, the signal resulting from this reverse phase addition will include solely intermodulation products that are caused by non-linearities of the first amplifier 201. These intermodulation products are amplified in a second linear amplifier 206. The output signal from the first amplifier 201 is coupled to an input of a fourth directional coupler 208 via a second delay line 207, and the output signal from the second amplifier is coupled to a second input of the fourth directional coupler 208, via a second phase shifter 209. The input signals are added together in the fourth directional coupler 208, with the intention of generating a power amplifier output signal that contains negligible third order intermodulation products. In order to neutralise third order intermodulation products in the output signal from the power amplifier 200, it is necessary for the intermodulation products from the second amplifier 206 to have the same power level as the intermodulation products in the output signal from the first amplifier 201 but the opposite phase, when adding the signals in the fourth directional coupler 208. Power level is adjusted by adjusting the second amplifier 206 and the directional coupler 208, whereas phase adjustment is effected by adjusting the second phase shifter 209.

FIGS. 6A–6C show simplified frequency spectrums that illustrate the principle appearance of the frequency spectrums of some of the signals discussed with reference to FIG. 1.

FIG. 6A illustrates an imaginary input signal to the power amplifier 200 in FIG. 2. The input signal is comprised of a composite radio signal that includes two carrier waves C1 and C2 having respective carrier waves frequencies F1 and F2. FIG. 6A is simplification of an actual composite radio signal, since a frequency spectrum of an actual radio signal that includes two modulated carrier waves will not solely consist of two distinct tones but will have a certain amount of spread about respective carrier wave frequencies. FIG. 6A also illustrates in principle the output signal from the power amplifier 200. It will be noted, however, that the power level of the output signal from the power amplifier 200 is considerably higher than the power level of the input signal.

Shown in FIG. 6B is the output signal from the first amplifier 201 in FIG. 2. The output signal includes both of the amplified carrier waves C1 and C2 and also third order intermodulation products IM1 and IM2 that have been generated in the first amplifier 201.

FIG. 6C shows the output signal from the second amplifier 206. This signal includes solely the intermodulation products IM1 and IM2.

One problem with the power amplifier 200 illustrated in FIG. 2 is that all components located downstream of the first amplifier 201, i.e. the third directional coupler 205, the second delay line 206 and the fourth directional coupler 208, cause significant power losses in the signal generated from the power amplifier 200.

Figure 3:
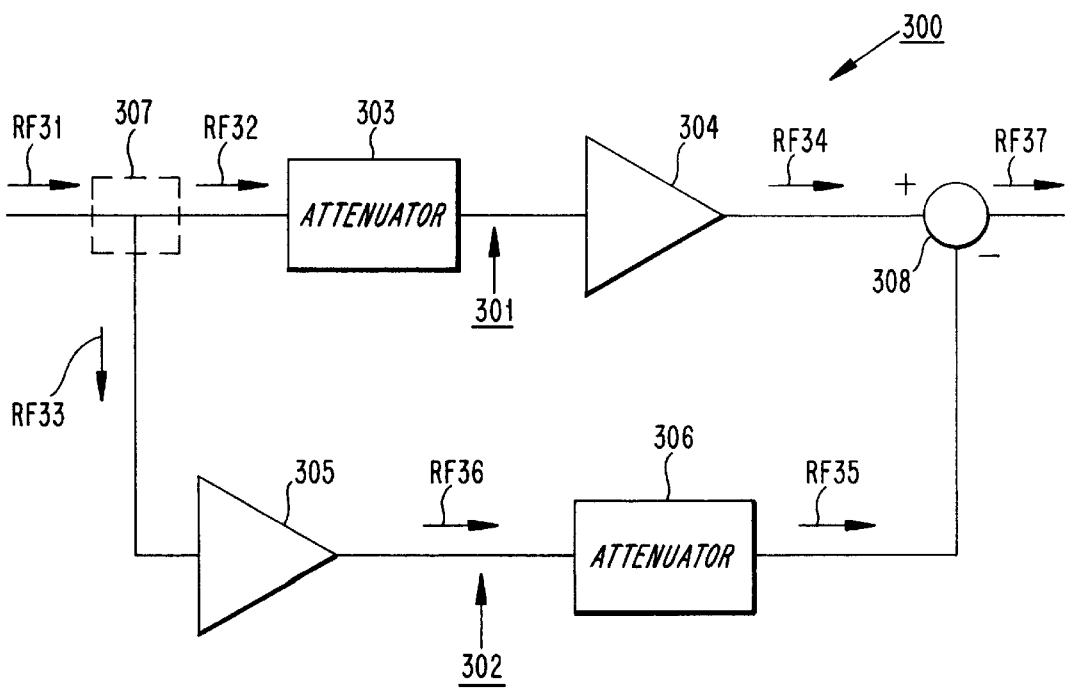
FIG. 3 is a block schematic illustrating a power amplifier according to German Patent Specification DE 27 18 172.

FIG. 3 illustrates an amplifier 300 according to the description given in German Patent Specification DE 27 18 172. The amplifier 300 includes a first signal path 301 and a second signal path 302. The first signal path includes a first attenuator 303 coupled in series with a first amplifier 304. The second signal path 302 includes a second amplifier 305 coupled in series with a second attenuator 306. The amplifier 300 also includes a division means 302 and an addition means 308. The division means 307 has two outputs, which are connected to the beginning of respective first and second signal paths 301 and 302, and an input. The addition means 308 has two inputs, which are connected respectively to the end of the first and second signal paths 301 and 302, and an output.

A first signal RF31, which may consist of a composite radio signal that includes two modulated carrier waves, enters the amplifier 300 and is received on the input of the division means, which functions to divide the received signal RF31 into a second signal RF32 and a third signal RF33 and thereafter distribute these two signals to the first signal path 301 and to the second signal path 302 respectively. The second signal RF32 is attenuated in the first attenuator 303 in the first signal path 301, prior to being amplified in the first amplifier 304. In addition to the amplified modulated carrier waves, the output signal RF34 from the first amplifier 304 also includes intermodulation products that have arisen as a result of non-linearities of the first amplifier 304. The latter output signal RF34 has a first relationship between the levels of the modulated carrier waves and the intermodulation products included in the signal. The third signal RF33 is amplified in the second amplifier 305 in the second signal path, so that the amplified modulated carrier waves in the output signal RF36 from the second amplifier will be stronger than the modulated carrier waves in the output signal RF34 from the first amplifier 304. The intermodulation products grow exponentially with rising output voltages from a non-linear amplifier. This means that the intermodulation products that arise in the output signal RF36 from the second amplifier 305 are considerably stronger in relation to the amplified modulated carrier waves in the same signal RF36 than was the case for the intermodulation products and the amplified modulated carrier waves in the output signal RF34 from the first amplifier 304.

The output signal RF36 from the second amplifier 305 is attenuated in the second attenuator 306 to obtain a signal RF35, where the levels of the intermodulation products in the attenuated signal RF35 and in the output signal RF34 from the first amplifier 304 respectively correspond to one another. The signals RF35 and RF34 just mentioned are added together in reverse phase in the addition means 308, and the intermodulation products neutralise each other in the resultant signal RF37 outputted from the addition means 308 and the amplifier 300.

The amplifier 300 shown in FIG. 3 has very few loss-causing components connected downstream of the first amplifier 304. However, when seen totally, this amplifier 300 results in large power losses and is consequently rather unsuitable for use as a power amplifier. This is partly due to the high amplification with subsequent attenuation that takes place in the second signal path 302. It is also due to the not negligible residues of the modulated carrier waves in the signal RF35 outputted from the second attenuator 306, which extinguishes a corresponding part of the modulated carrier waves in the output signal RF34 from the first amplifier 304 in the reverse phase addition process, and consequently reduces the power of the output signal RF37 from the amplifier 300.

Figure 4:
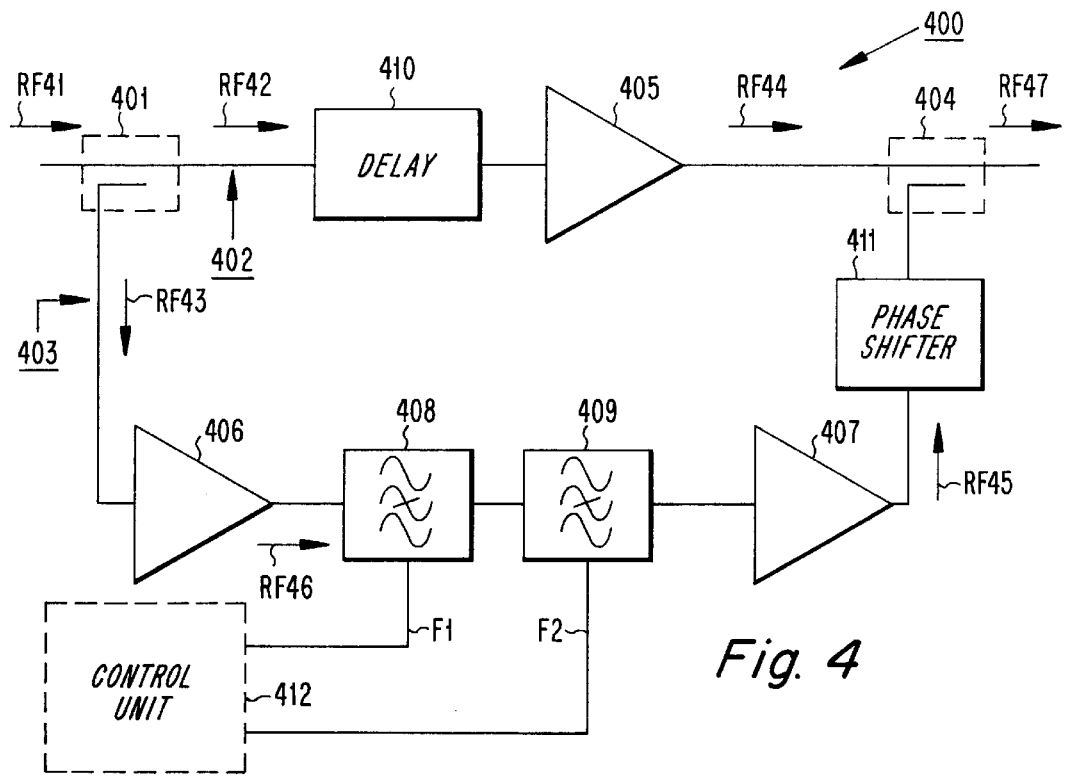
FIG. 4 is a block schematic illustrating a power amplifier according to a first embodiment of the present invention.

The invention aims to provide a power amplifier that is more efficient than the earlier known amplifiers illustrated in FIG. 2 and FIG. 3. FIG. 4 illustrates a power amplifier 400 according to a first embodiment of the present invention. The power amplifier 400 is intended for amplifying a first composite radio signal RF41 that includes at least two modulated carrier waves. The power amplifier 400 includes a first signal path 402 and a second signal path 403. The first signal path 402 includes a delay line 410 coupled in series with a first amplifier 405.

The second signal path 403 includes a second amplifier 406 coupled in series with a first band-stop filter 408 and a second band-stop filter 409 followed by a third linear amplifier 407 and a phase shifter 411. The power amplifier 400 also includes a first directional coupler 401 and a second directional coupler 404. The first directional coupler 401 has an input and two outputs, where the outputs are connected to an input of the delay line 410 in the first signal path 402 and to an input on the second amplifier 406 in the second signal path 403. The second directional coupler 404 has two inputs and an output, where the inputs are connected to an output from the first amplifier 405 in the first signal path 402 and also to an output from the phase shifter 411 in the second signal path 403.

The first composite radio signal RF41, which constitutes an input signal to the power amplifier 400, is received on the input of the first directional coupler 401. The first directional coupler 401 functions as a division means which divides the first radio signal RF41 into a second radio signal RF42 and a third radio signal RF43, which are distributed to respective signal paths 402, 403. FIG. 6A illustrates the principle appearance of respective frequency spectrums of the radio signals RF41-RF43. These radio signals all contain the two modulated carrier waves C1 and C2. It will be noted, however, that the power of the other two signals RF42 and RF43 is lower, as a result of dividing the first radio signal RF41. The first radio signal RF41 is conveniently divided so that the powers of the second radio signal RF42 and the third radio signal RF43 will be equally as large and each equal to almost half of the power of the first radio signal RF41.

The second radio signal RF42 is delayed in the delay line 410 in the first signal path 402 before being amplified in the first amplifier 405 to obtain a fourth radio signal RF44. Intermodulation products appear in the fourth radio signal RF44, due to non-linearities of the first amplifier 405. FIG. 6B shows the principle appearance of the frequency spectrum of the fourth radio signal RF44.

The third radio signal RF43 is amplified in the second amplifier 406 in the second signal path 403 to obtain a sixth radio signal RF46. Intermodulation products appear in the sixth radio signal RF46, due to non-linearities of the second amplifier 406. FIG. 6B illustrates the principle appearance of the frequency spectrum of the sixth radio signal RF46.

The second signal path 403 functions to form a fifth radio signal RF45 from the sixth radio signal RF46. This is effected by filtering-out the modulated carrier waves in respective band-stop filters 408 and 409, whereafter the filtered signal is amplified in the third amplifier 407. FIG. 6C illustrates the principle appearance of the frequency spectrum of the fifth radio signal RF45.

An output signal RF47 is generated from the power amplifier 400 on the output of the second directional coupler 404, by reverse phase addition of the forth radio signal RF44 and the fifth radio signal RF45, therewith suppressing the intermodulation products in the output signal RF47. FIG. 6A illustrates the principle appearance of the frequency spectrum of the output signal RF47 from the power amplifier 400 under ideal conditions, i.e. when the intermodulation products have been totally eliminated. The frequency spectrum of the output signal RF47 contains the same frequency components as the first radio signal RF41, i.e. the modulated carrier waves C2 and C2, but has a much higher power than the first radio signal RF41.

The reverse phase addition is effected by phase-shifting the fifth radio signal RF45 in the phase shifter 411, so that the phase of said signal will be the reverse, or the opposite, of the phase of the fourth radio signal RF44, whereafter the phase-shifted fifth radio signal RF45 and the fourth radio signal RF44 are added together in the second directional coupler 404.

The phase shifter 411 and the second directional coupler 404 can be considered to form together an addition means for reverse phase addition of the fourth radio signal RF44 and the fifth radio signal RF45. The delay line 410 is dimensioned so that the fourth radio signal RF44 and the fifth radio signal RF45 will have the same time position on the occasion of said reverse phase addition, i.e. so that the time taken for a signal to travel from the first directional coupler 401 to the second directional coupler 404 will be the same for both of the signal paths 402 and 403 respectively.

The third amplifier 407 can be considered as means for adjusting, or adapting, the power and voltage levels of the intermodulation products in the fifth radio signal RF45, so that these values will correspond to the level values of the fourth radio signal RF44.

The two band-stop filters 408–409 can, together, be considered as means for selectively suppressing the modulated carrier waves in the sixth radio signal RF46. The power amplifier 400 can be adapted to different carrier wave frequencies, suitably with the aid of band-stop filters with which the centre frequencies of the stop bands can be set electrically to match the carrier wave frequencies F1 and F2 (see FIG. 6B) of the modulated carrier waves to be filtered out. The band-stop filters 408–409 used can be, and are, set electrically so that the centre frequencies of the stop band of the first band-stop filter 408 and of the second band-stop filter are set to respective frequencies F1 and F2. The band-stop filters 408–409 may be set, for instance, from a control unit 412 in a base station on the basis of configuration parameters downloaded in the control unit prior to bringing the base station into operation. It will be understood, however, that permanently set band-stop filters may be used in those cases where the carrier wave frequencies need not be changed.

The power amplifier 400 in FIG. 4 can be adapted for amplification of a composite radio signal that contains more than two modulated carrier waves, by adding further band-stop filters in the second signal path 403.

Figure 5:
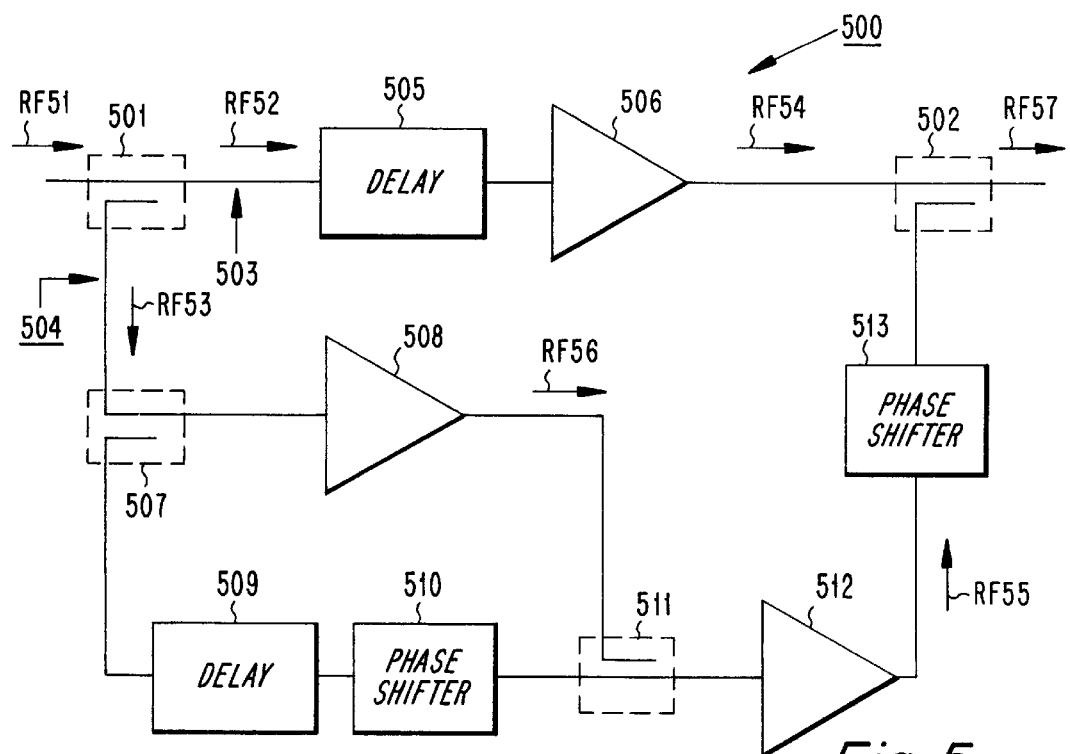
FIG. 5 is a block schematic illustrating a power amplifier according to a second embodiment of the present invention.

FIG. 5 illustrates a power amplifier 500 according to a second embodiment of the present invention. The power amplifier 500 is intended for amplifying a first composite radio signal RF51 that includes at least two modulated carrier waves. The power amplifier 500 includes a first directional coupler 501, a second directional coupler 502, a first signal path 503 and a second signal path 504. The first signal path 503 includes a first delay line 505 which is coupled in series with a first amplifier 506. The second signal path 504 includes a third directional coupler 507 that has one input and two outputs. One output from the third directional coupler 507 is connected to an input on a second amplifier 508. The second output from the third directional coupler 507 is connected to a second delay line 509 which, in turn, is coupled in series to a second phase shifter 510. A fourth directional coupler 511 has two inputs and one output and one of its inputs is connected to an output of the second amplifier 508 and its other input is connected to an output on the second phase shifter 510. The output from the fourth directional coupler 511 is connected to a third linear amplifier 512 which, in turn, is series-connected to a first phase shifter 513. The first directional coupler 501 has one input and two outputs, where said outputs are connected to an input on the first delay line 505 in the first signal path 503, and to the input on the third directional coupler 507 in the second signal path 504 respectively. The second directional coupler 502 has two inputs and one output, where the inputs are connected respectively to an output from the first amplifier 506 in the first signal path 502 and to an output from the first phase shifter 513 in the second signal path 504.

The first composite radio signal RF51 constitutes an input signal to the power amplifier 500 and is received on the input of the first directional coupler 501. The first directional coupler 501 functions as means for dividing the first radio signal RF51 into a second radio signal RF52 and a third radio signal RF53, these radio signals being distributed to respective signal paths 503, 504.

The second radio signal RF52 is delayed in the first delay line 505 in the first signal path 503 prior to being amplified in the first amplifier 506 to form a fourth radio signal RF54. The fourth radio signal RF54 will contain intermodulation products, due to non-linearities of the first amplifier 506.

The third radio signal RF53 is amplified in the second amplifier 508 in the second signal path 504 to form a sixth radio signal RF56. Intermodulation products will appear in the sixth radio signal RF56, because of non-linearities of the second amplifier 508.

The second signal path 504 is adapted to form a fifth radio signal RF55 from the sixth radio signal RF56. In the case of this embodiment of the invention, the signal generation is effected by virtue of the third directional coupler 507 and the second delay line 509 together functioning as a means for feeding a part of the third radio signal RF53 forwards to the second phase shifter 510. The second phase shifter 510 and the fourth directional coupler 511 together function as a second means for adding together in reverse phase the sixth radio signal RF56 and the forwardly fed part of the third radio signal RF53. In this respect, the second delay line 509 is set to compensate for the time delay occurring in the second amplifier 508, the second phase shifter 510 is set so that the aforesaid signal addition takes place in reverse phase, and the third directional coupler 507 and the fourth directional coupler 511 are set respectively so that the modulated carrier waves will be neutralised on the occasion of said signal addition. Finally, the fifth radio signal RF55 is generated by amplifying the output signal from the fourth directional coupler 511 in the third amplifier 512.

An output signal RF57 is generated from the power amplifier 500 on the output of the second directional coupler 502 by reverse phase addition of the fourth radio signal RF54 and the fifth radio signal RF55. This reverse phase addition process is effected by phase-shifting the fifth radio signal RF55 in the phase shifter 513, so as to bring the fifth signal in the reverse or opposite phase to the fourth radio signal RF54, whereafter the phase-shifted fifth radio signal RF55 and the fourth radio signal RF54 are added together in the second directional coupler 502.

Taken together, the phase shifter 513 and the second directional coupler 502 can be considered to form addition means for the reverse phase addition of the fourth radio signal RF54 to the fifth radio signal RF55. The first delay line is dimensioned so that the fourth radio signal RF54 and the fifth radio signal RF55 have mutually the same time position upon the occasion of the reverse phase addition, i.e. so that the time taken for a signal to travel from the first directional coupler 501 to the second directional coupler 502 is the same for both signal paths 503 and 504 respectively.

The third amplifier 512 can be considered as a means for adapting the power and the voltage levels of the intermodulation products in the fifth radio signal RF55, so that these levels will correspond to the levels of the fourth radio signal RF54.

In the case of this second embodiment, the feedforward means, which includes the third directional coupler 507 and the second delay line 509, together with the second addition means, which includes the second phase shifter 510 and the fourth directional coupler 511, can be considered to constitute means for selective suppression of the modulated carrier waves in the sixth radio signal RF56.

In the second embodiment, the radio signals RF51–RF57 have direct correspondence in the radio signals RF41–RF47 in the first embodiment. The principle appearance of the frequency spectrum for respective radio signals RF51–RF57 in the second embodiment is the same as the frequency spectrum of corresponding radio signals RF41–RF47 in the first embodiment and are thus apparent from FIGS. 6A–6C.

The two embodiments differ in respect of how selective suppression of the modulated carrier waves takes place. The advantage with the FIG. 5 embodiment is that the complexity of the power amplifier 500 will not increase with increasing numbers of carrier waves in the composite radio signal that is amplified.

The first and the second amplifier, in which intermodulation products arise, will preferably have similar non-linear characteristics. Beneficially, the two amplifiers will be chosen so that the second amplifier will generate for a given input signal an output signal whose power is much lower than the power of a corresponding output signal from the first amplifier. Thus, the fifth radio signal, RF45 and RF55 respectively, is generated by first generating at a low power level intermodulation products which, subsequent to selective suppression of the modulated carrier waves, is amplified in the third linear amplifier 407 and 512 respectively, so that the fifth radio signal will obtain the correct power level. The efficiency achieved in this way is much higher than the efficiency achieved with the amplifier illustrated in FIG. 3. Furthermore, the use of a lower power output level from the second amplifier 406 in FIG. 4 enables the second amplifier 406 and the band-stop filters 408–409 to be dimensioned for low power, therewith enabling these components to be made smaller and less expensive.

FIGS. 7A and 7B illustrate a suitable manner of implementing the first amplifier 405 and the second amplifier 406 shown in FIG. 4.

As evident from FIG. 7A, the first amplifier 405 in FIG. 4 includes a first number of amplifying elements 71 that are connected in parallel so as to enable the amplifier 405 to deliver the requisite power.

As evident from FIG. 7B, the second amplifier 406 in FIG. 4 includes only one amplifier element 71 of the same type as in the first amplifier 405.

In e.g. a GSM base station, the first amplifier 405 can be constructed with a starting point from a so-called RF power transistor having model designation PTB 20219 from Ericsson Inc. Power Products. The second amplifier 406 can be constructed with a starting point from a version of PTB 20219 that has been scaled down with regard to power, i.e. in accordance with what has been described with reference to FIGS. 7A and 7B.

Because the second amplifier includes fewer parallel-connected amplifier elements of the same type as in the first amplifier, the second amplifier 406 and the first amplifier 405 will both have a similar non-linear characteristic, while, at the same time, the second amplifier 406 will operate at a lower power level than the first amplifier 405.

A power amplifier according to the invention can be realised advantageously in one single MMIC (Monolithic Microwave Integrated Circuit). An additional advantage obtained when the inventive power amplifier is implemented in a single MMIC is that variations in properties of the amplifiers due to differences in semi-conductor material and the process used in chip manufacture are minimised, owing to the fact that the first and the second amplifier both lie on the same chip.

Figure 8:
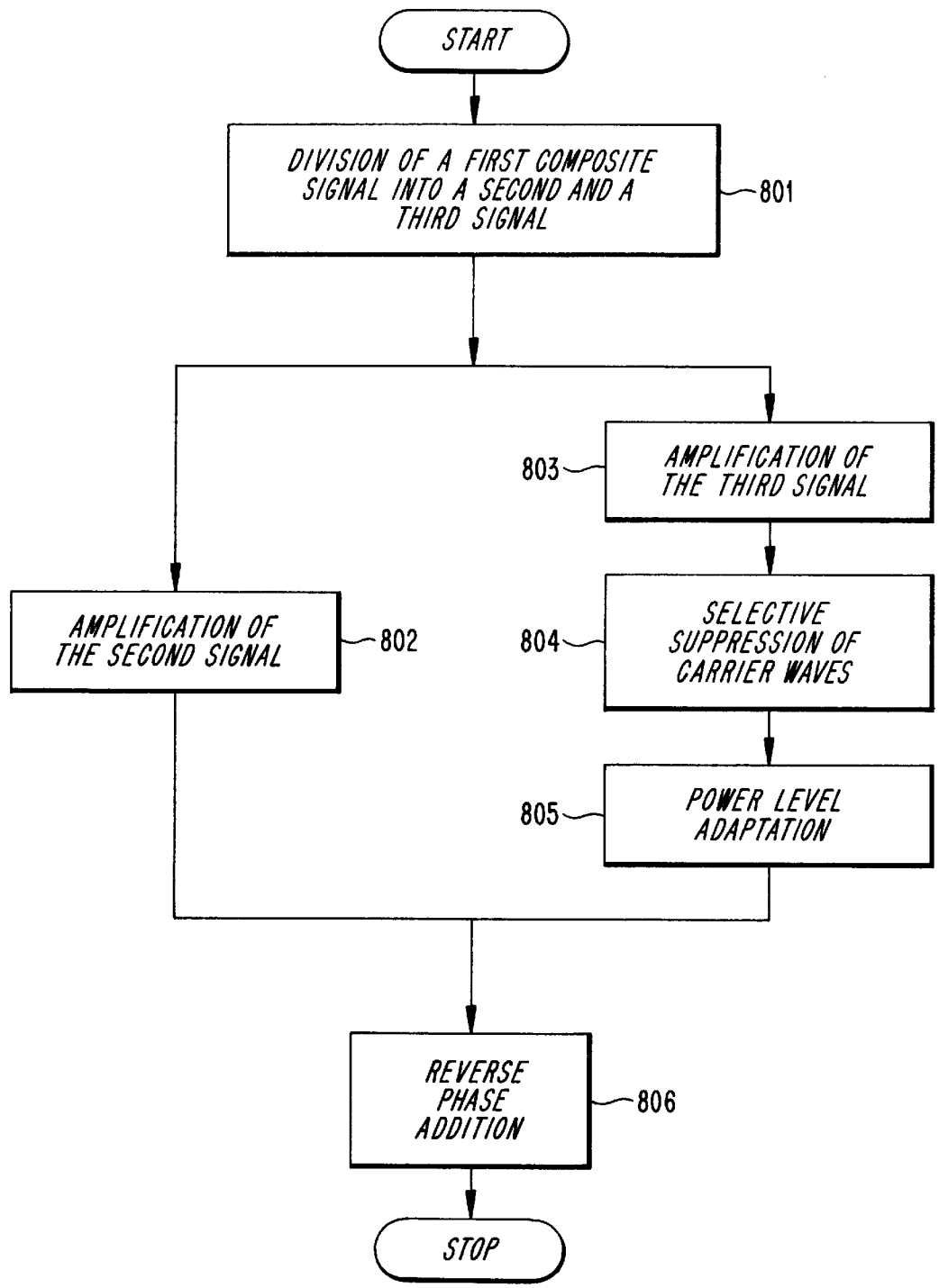
FIG. 8 is a flowchart illustrating an inventive method.

FIG. 8 is a flowchart that illustrates a method according to the invention. The method is described below with simultaneous reference to FIG. 8, FIG. 4 and FIGS. 6A–6C. In step 801, a first composite radio signal RF41 is divided into a second radio signal RF42 and a third radio signal RF43.

After step 801, the flowchart separates into a branch that includes the method step 802 and a branch that includes the method steps 803–805, where respective branches describe signal processing carried out in parallel in a first signal path 402 and in a second signal path 403 respectively.

In step 802, the second radio signal RF42 is amplified in a first amplifier 405 to provide a fourth radio signal RF44, wherewith intermodulation products IM1, IM2 arise in the fourth radio signal RF44.

In steps 803–805, there is generated a fifth radio signal RF45 by processing the third radio signal RF43. In step 803, the third radio signal RF43 is amplified in a second amplifier RF406 to provide a sixth radio signal RF46, wherewith intermodulation products IM1, IM2 arise in the sixth radio signal RF46. The fifth radio signal RF45 is formed from the sixth radio signal RF46, by selective suppression in step 804 of the modulated carrier waves C1, C2 in the sixth radio signal RF46, whereafter the power of the signal resulting from step 804 is adapted in step 805 so that the power level of the intermodulation products IM1, IM2 in the fifth radio signal RF45 will correspond to the power level of the intermodulation products IM1, IM2 in the fourth radio signal RF44.

Finally, an output signal RF47 from the power amplifier is generated in step 806, by reverse phase addition of the fourth radio signal RF44 and the fifth radio signal RF45.

What is claimed is:

1. A method relating to the amplification in a power amplifier of a first composite radio signal that includes at least two modulated carrier waves wherein the method comprises the steps of:

a) dividing the first composite radio signal into a second radio signal and a third radio signal;

b) amplifying the second radio signal in a first amplifier belonging to a first signal path such as to generate a fourth radio signal, wherewith intermodulation arise in the fourth radio signal;

c) signal processing the third radio signal in a second signal path such as to generate a fifth radio signal;

d) generating an output signal from the power amplifier by reverse phase addition of the fourth radio signal to the fifth radio signal, wherein the signal processing in step c) comprises e) amplifying the third radio signal in a second amplifier to generate a sixth radio signal, wherewith intermodulation arise in the sixth radio signal;

f) generating the fifth radio signal from the sixth radio signal, and wherein step f) further comprises g) selective suppression of the modulated carrier waves in the sixth radio signal.

2. A method according to claim 1, wherein step f) further comprises:

h) adaptation of the power level of the intermodulation products in the fifth radio signal such that said power level will correspond to the power level of the intermodulation products in the fourth signal.

3. A method according to claim 1, wherein the first amplifier and the second amplifier have similar non-linear properties.

4. A method according to claim 1, further comprising the step of generating for a given input signal an output signal from the second amplifier that has a lower power than a corresponding output signal from the first amplifier.

5. A method according to claim 1, wherein said selective suppression of the modulated carrier waves in step g) is effected by filtering out said modulated carrier waves.

6. A method according to claim 1, wherein said selective suppression of the modulated carrier waves in step g) is effected by reverse phase addition of the sixth radio signal to a forwardly fed part of the third radio signal.

7. A power amplifier for amplifying a first composite radio signal, the first radio signal that includes two modulated carrier waves, said power amplifier comprising:

means for dividing the first radio signal into a second radio signal and a third radio signal;

a first signal path adapted to generate a fourth radio signal;

a second signal path adapted to generate a fifth radio signal;

a first addition means for generating an output signal from the power amplifier by reverse phase addition of the fourth radio signal to the fifth radio signal; wherein the dividing means is connected to both the first signal path and the second signal path and is adapted to distribute the second radio signal and the third radio signal to respective signal paths; wherein the first signal path is adapted to generate the fourth radio signal by amplifying the second radio signal in a first amplifier, wherewith intermodulation products arise in the fourth signal; wherein the second signal path is adapted to generate a sixth radio signal by amplifying the third radio signal in a second amplifier, wherewith intermodulation products arise in the sixth radio signal; wherein the second signal path is also adapted to generate the fifth radio signal from the sixth radio signal, wherein said second signal path include suppression means adapted to selectively suppress the modulated carrier waves in the sixth radio signal.

8. A power amplifier according to claim 7, wherein the second signal path includes adaptation means for causing the power level of the intermodulation products in the fifth radio signal to correspond to the level of the intermodulation products in the fourth radio signal.

9. A power amplifier according to claim 7, wherein the first amplifier and the second amplifier have similar non-linear properties.

10. A power amplifier according to claim 7, wherein the second amplifier is adapted to generate for a given input signal an output signal whose power is considerably lower than the power of a corresponding output signal from the first amplifier.

11. A power amplifier according to claim 10, wherein the first amplifier includes a first number of parallel-connected amplifier elements of given type; and that the second amplifier includes a second, fewer number of amplifier elements of the same type as those in the first amplifier.

12. A power amplifier according to claim 7, wherein the suppression means includes band-stop filters adapted to filter out said modulated carrier waves.

13. A power amplifier according to claim 7, wherein the suppression means includes:

a feedforward means which is connected in the second signal path upstream of the second amplifier and functions to feed forwards a part of the third radio signal; and a second addition means which is connected to the second amplifier and to the feedforward means and which is adapted to add in reverse phase the sixth radio signal to the forwardly fed part of said third radio signal.

* * * * *